(12) United States Patent
Ryu et al.

(10) Patent No.: US 7,616,674 B2
(45) Date of Patent: Nov. 10, 2009

(54) SEMICONDUCTOR LASER DIODE ARRAY

(75) Inventors: Han-youl Ryu, Suwon-si (KR); Ok-hyun Nam, Seoul (KR); Kyoung-ho Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/513,053

(22) Filed: Aug. 31, 2006

(65) Prior Publication Data
US 2007/0237200 A1    Oct. 11, 2007

(30) Foreign Application Priority Data
Apr. 11, 2006  (KR) .................... 10-2006-0032746

(51) Int. Cl.
*H01S 5/40* (2006.01)
(52) U.S. Cl. .............. 372/50.122; 372/50.12; 372/50.121
(58) Field of Classification Search .......... 372/50.12, 372/50.121, 50.122
See application file for complete search history.

(56) References Cited

U.S. PATENT DOCUMENTS

| | | | | |
|---|---|---|---|---|
| 6,136,623 A | * | 10/2000 | Hofstetter et al. | 438/28 |
| 6,956,322 B2 | * | 10/2005 | Ikeda | 313/498 |
| 2004/0105471 A1 | * | 6/2004 | Kneissl et al. | 372/36 |
| 2005/0175053 A1 | * | 8/2005 | Kimura et al. | 372/50.12 |
| 2006/0045156 A1 | * | 3/2006 | Hata et al. | 372/43.01 |
| 2006/0202188 A1 | * | 9/2006 | Ueta et al. | 257/14 |

* cited by examiner

*Primary Examiner*—Minsun Harvey
*Assistant Examiner*—Michael Carter
(74) *Attorney, Agent, or Firm*—Cantor Colburn LLP

(57) ABSTRACT

A semiconductor laser diode array is provided. The semiconductor laser diode array includes: a lower semiconductor laser diode chip having a dual structure including a lower substrate, a first laser generating region disposed on the lower substrate, and a second laser generating region disposed on the lower substrate and separated from the first laser generating region; an upper semiconductor laser diode chip having a dual structure including an upper substrate, a third laser generating region disposed on the upper substrate, and a fourth laser generating region disposed on the upper substrate and separated from the third laser generating region; and an electrode unit electrically connecting the first through fourth laser generating regions to the outside. The first and second laser generating regions are vertically bonded to the third and fourth laser generating regions, respectively, so that the first through fourth light-emitting points in the first through fourth laser generating regions from which laser beams are emitted are arranged in a two-dimensional fashion.

21 Claims, 3 Drawing Sheets

SEMICONDUCTOR LASER DIODE ARRAY

CROSS-REFERENCE TO RELATED PATENT APPLICATION

This application claims the benefit of Korean Patent Application No. 10-2006-0032746, filed on Apr. 11, 2006, in the Korean Intellectual Property Office, the disclosure of which is incorporated herein in its entirety by reference.

BACKGROUND OF THE DISCLOSURE

1. Field of the Disclosure

The present disclosure relates to a semiconductor laser diode array, and more specifically, to a semiconductor laser diode array with dual semiconductor laser diode chips having two laser generating regions, which are attached to each other.

2. Description of the Related Art

A semiconductor laser diode uses the characteristics of a compound semiconductor to convert an electrical signal into laser light. Semiconductor laser diodes are used in various fields including image-forming apparatuses. For example, a semiconductor laser diode used in a light-scanning unit for an image-forming apparatus for printing an image on paper such as a printer or copier emits laser light to form an electrostatic latent image on a photoreceptor drum.

In recent years, the image-forming apparatus requires high-speed high-resolution printing. For high resolution printing, the image-forming apparatus employs a technique which scans a smaller spot diameter by using a nitride semiconductor blue laser diode instead of a conventional infrared or red laser diode. Also, for high speed printing, a method for simultaneously scanning a plurality of laser beams is being developed. Typically, laser diodes in a laser diode array for simultaneously emitting a plurality of laser beams should be arranged at small intervals, e.g., less than about 20 μm. Thus, the development of a compact nitride semiconductor laser diode array is a key technical task for achieving high-speed high resolution printing. In particular, because the interval between laser diodes in a semiconductor laser diode array is very small, it becomes critical to efficiently form a p-metal layer in order to independently drive each laser diode.

SUMMARY OF THE DISCLOSURE

The present invention may provide a semiconductor laser diode array having light-emitting points arranged at small intervals and a simple electrode unit.

According to an aspect of the present invention, there may be provided a semiconductor laser diode array including: a lower semiconductor laser diode chip having a dual structure including a lower substrate, a first laser generating region disposed on the lower substrate, and a second laser generating region disposed on the lower substrate and separated from the first laser generating region; an upper semiconductor laser diode chip having a dual structure including an upper substrate, a third laser generating region disposed on the upper substrate, a fourth laser generating region disposed on the upper substrate and separated from the third laser generating region; and an electrode unit electrically connecting the first through fourth laser generating regions to the outside. The first and second laser generating regions are vertically bonded to the third and fourth laser generating regions, respectively, so that the first through fourth light-emitting points in the first through fourth laser generating regions from which laser beams are emitted are arranged in a two-dimensional fashion.

BRIEF DESCRIPTION OF THE DRAWINGS

The above and other features and advantages of the present invention are illustrated in detailed exemplary embodiments thereof with reference to the attached drawings in which.

DETAILED DESCRIPTION OF EXEMPLARY EMBODIMENTS

Figure 1:
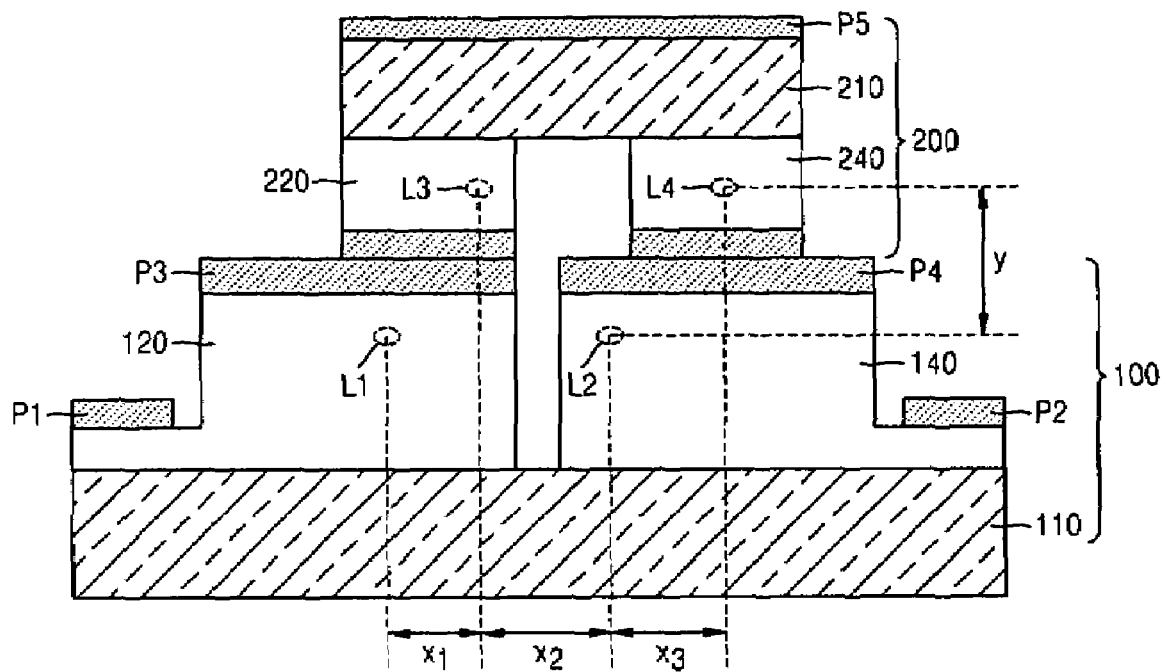
FIG. 1 is a cross-sectional view of a semiconductor laser diode array according to an embodiment of the present invention.
Figure 2:
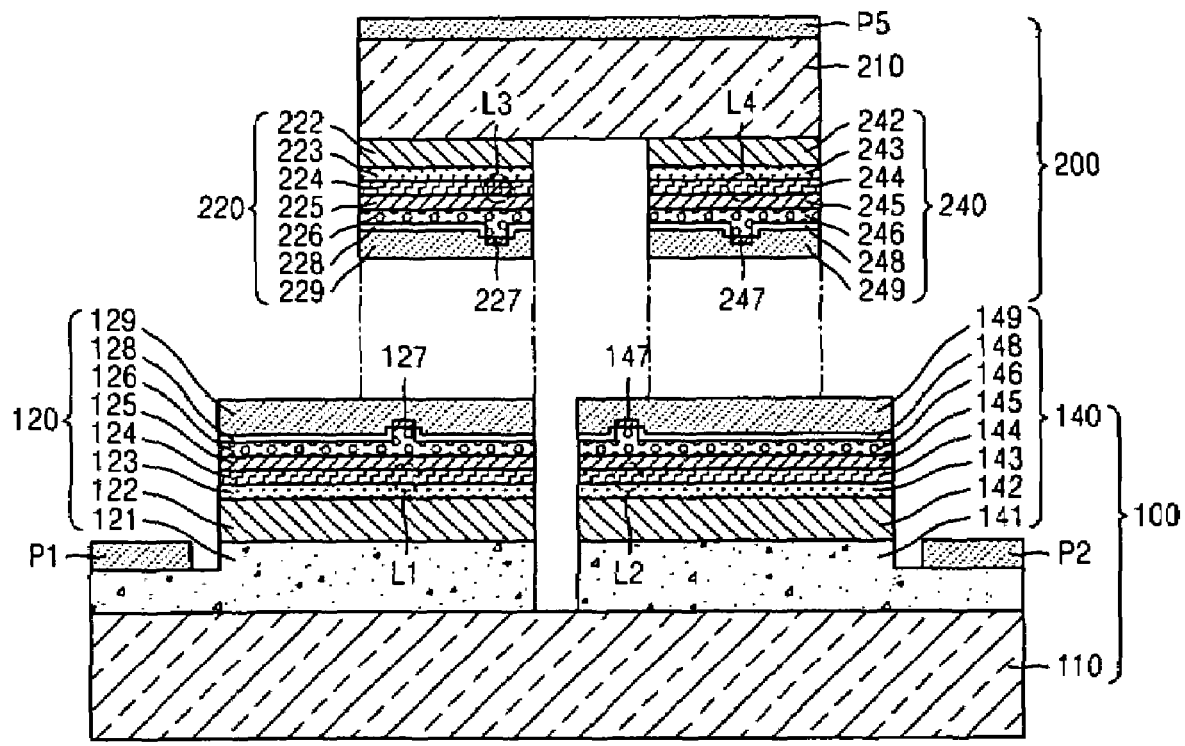
FIG. 2 is an exploded cross-sectional view of FIG. 1.
Figure 3:
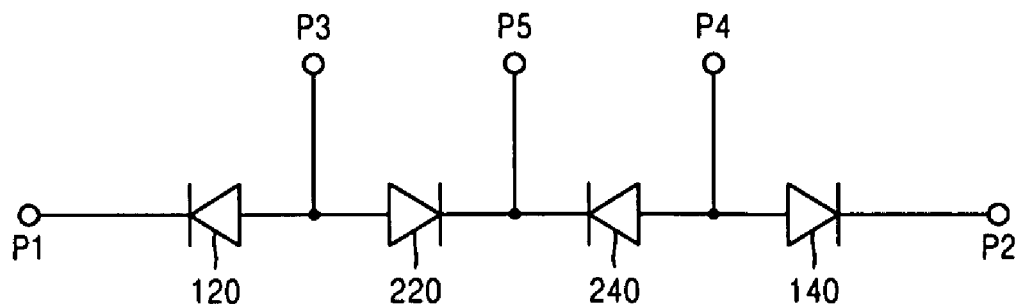
FIG. 3 is a circuit diagram of the semiconductor laser diode array of FIG. 1.

FIG. 1 is a schematic cross-sectional view of a semiconductor laser diode array according to an embodiment of the present invention. FIG. 2 is an exploded cross-sectional view of FIG. 1, and FIG. 3 is an electrical circuit diagram of FIG. 1.

Referring to FIG. 1, the semiconductor laser diode array according to an embodiment of the present invention includes a lower semiconductor laser diode chip 100 having a dual structure including first and second laser generating regions 120 and 140, and an upper semiconductor laser diode chip 200 having a dual structure having third and fourth laser generating regions 220 and 240. The upper semiconductor laser diode chip 200 is vertically attached face down to the lower semiconductor laser diode chip 100. The lower and upper semiconductor laser diode chips 100 and 200 are side-emitting laser diodes. First through fourth light-emitting points L1 through L4 of the first through fourth laser generating regions 120, 140, 220, and 240, from which laser beams are emitted, are arranged two-dimensionally on sides of the first through fourth laser generating regions 120, 140, 220, and 240.

The lower semiconductor laser diode chip 100 has a dual ridge structure including the first and second laser generating regions 120 and 140 stacked on a lower substrate 110. A non-conductive substrate, such as a sapphire substrate, may be used as the lower substrate 110. A heat sink (not shown) may be disposed below the lower substrate 110 so as to efficiently dissipate heat generated in the first through fourth laser generating regions 120, 140, 220, and 240. The first laser generating region 120 is separated from the second laser generating region 140 by a predetermined distance.

Referring to FIG. 2, the first laser generating region 120 includes a first n-contact layer 121, a first n-clad layer 122, a first n-waveguide layer 123, a first active layer 124, a first p-waveguide layer 125, a first p-clad layer 126, a first p-metal layer 127 and a first bonding metal layer 129 sequentially stacked on the lower substrate 110.

The first n-contact layer 121, the first n-clad layer 122, the first n-waveguide layer 123, the active layer 124, the first p-waveguide layer 125 and the first p-clad layer 126 may be formed of a compound selected among nitride semiconductor compounds represented by the general formula $Al_xIn_yGa_{1-(x+y)}N$ ($0 \leq x \leq 1$, $0 \leq x \leq 1$, and $0 \leq x+y \leq 1$) as a main element.

The first active layer 124 may have a commonly known structure such as single quantum well (SQW) or multi quantum well (MQW) structure. The first p-clad layer 126 has a striped ridge projecting upward. The ridge limits the amount of current being injected to restrict a cavity for lasing in the first active layer 124, thereby decreasing a threshold current for lasing and suppressing multiple transverse mode oscillation. Laser light resonates and oscillates in the first n-waveguide layer 123, the first active layer 124, and the first p-waveguide layer 125 and is emitted through a side of the first laser generating region 120.

The first p-metal layer 127 is formed on the ridge of the first p-clad layer 126. The first p-clad layer 126 and the first p-metal layer 127 are covered with the first bonding metal layer 129. A first insulating layer 128 of an insulating dielectric material is interposed between the first p-clad layer 126 and the first bonding metal layer 129.

The second laser generating region 140 is disposed on the lower substrate 110 and is separated from the first laser generating region 120. The second laser generating region 140 includes a second n-contact layer 141, a second n-clad layer 142, a second n-waveguide layer 143, a second active layer 144, a second p-waveguide layer 145, a second p-clad layer 146, a second p-metal layer 147 and a second bonding metal layer 149 sequentially stacked on the lower substrate 110. Because the second laser generating region 140 has substantially the same structure as the first laser generating region 120, a detailed explanation thereof is being omitted.

The upper semiconductor laser diode chip 200 has a dual ridge structure including the third and fourth laser generating regions 220 and 240 stacked on an upper substrate 210. The third laser generating region 220 includes a third n-clad layer 222, a third n-waveguide layer 223, a third active layer 224, a third p-waveguide layer 225, a third p-clad layer 226, a third p-metal layer 227, and a third bonding metal layer 229. A third insulating layer 228 is interposed between the third p-clad layer 226 and the third bonding metal layer 229. The fourth laser generating region 240 includes a fourth n-clad layer 242, a fourth n-waveguide layer 243, a fourth active layer 244, a fourth p-waveguide layer 245, a fourth p-clad layer 246, a fourth p-metal layer 247, and a fourth bonding metal layer 249. A fourth insulating layer 248 is interposed between the fourth p-clad layer 246 and the fourth bonding metal layer 249. The third and fourth laser generating regions 220 and 240 are simultaneously stacked on the upper substrate 210. Since each layer in the third and fourth laser generating regions 220 and 240 has substantially the same structure as its counterpart in the first laser generating region 210, a detailed explanation thereof will not be given.

An electrode unit electrically connecting the first through fourth laser generating regions 120, 140, 220, and 240 to the outside includes first through fifth electrodes P1 through P5. The first and second electrodes P1 and P2 are disposed on stepped portions of the first and second n-contact layers 121 and 141, respectively.

The first and second bonding metal layers 129 and 149 are respectively attached to the third and fourth bonding metal layers 229 and 249. In this case, portions of the first and second bonding metal layers 129 and 149 are exposed to act as third and fourth electrodes P3 and P4, respectively. When the lower and upper semiconductor laser diode chips 100 and 200 are bonded together in this way, the areas of the third and fourth bonding metal layers 229 and 249 may be less than those of the first and second bonding metal layers 129 and 149, respectively, so as to expose the portions of the first and second bonding metal layers 129 and 149.

The upper substrate 210 may be formed of a conductive material, such as GaN or SiC, and is supported by the third and fourth laser generating regions 220 and 240. The fifth electrode P5 is disposed on a surface of the upper substrate 200 opposite the surface supported by the third and fourth laser generating regions 220 and 240.

Referring to FIG. 3, the first and second electrodes P1 and P2 act as n-electrodes of the first and second laser generating regions 120 and 140, respectively. The third electrode P3 is a common p-electrode of the first and third laser generating regions 120 and 220 and the fourth electrode P4 is a common p-electrode of second and fourth laser generating regions 140 and 240. The fifth electrode P5 is a common n-electrode of the third and fourth laser generating regions 220 and 240. The first through fourth laser generating regions 120, 140, 220, and 240 can be independently driven through the first through fifth electrodes P1 through P5. Due to its simple structure, the semiconductor laser diode array having the above-mentioned electrode unit according to the present embodiment is easier to fabricate than a conventional quad-spot laser diode array having an air-bridge electrode structure as disclosed in U.S. Pat. No. 6,816,528.

In order to provide a sufficiently high resolution, a semiconductor laser diode array used for printer applications must have a sufficiently small interval between laser spots. Turning to FIG. 1, because a semiconductor laser diode having a dual ridge structure can provide an interval between the ridges less than several tens of micro meters, horizontal spacings x1 between the light-emitting points L1 and L3, x2 between the light-emitting points L3 and L2, and x3 between the light-emitting points L2 and L4 can be reduced to a sufficient degree. Further, because the first and second p-bonding metal layers 129 and 149 are bonded to the third and fourth p-bonding metal layers 229 and 249 for assembling between the lower and upper semiconductor laser diode chips 100 and 200, a vertical spacing y between the light-emitting points L1 and L3 or L2 and L4 can be reduced to a sufficient degree. A distance between centers of each of the light-emitting points L1 through L4 is less than approximately 50 μm, and preferably approximately 20 μm.

In the present embodiment, the first through fourth light-emitting points L1 through L4 are arranged in a staggered fashion when viewed in a horizontal plane. The light-emitting points L1 through L4 may be arranged at equal horizontal spacings (x1=x2=x3). The horizontal spacings x1, x2 and x3 are less than approximately 30 μm, and preferably approximately 5 μm. In a laser diode array used in a copier or printer for high-resolution printing, it is important to have laser spots distributed at regular small intervals in one direction. Because the semiconductor laser diode array of the current embodiment allows an interval between emitted laser beams to be kept small and regular in one direction, it is suitable for use in high-speed high-resolution copiers or printers.

While a conventional quad-spot laser diode array includes four laser generating regions fabricated simultaneously, the semiconductor laser diode array of the present embodiment includes dual lower and upper semiconductor laser diode chips 100 and 200 having two laser generating regions, which are vertically attached to each other. The semiconductor laser diode array of the present embodiment allows the selection of high-quality semiconductor laser diode chips before vertically bonding together the lower and upper semiconductor laser diode chips 100 and 200, thus providing uniform performance across the four laser generating regions and an improved yield rate compared to the conventional semiconductor laser diode array.

Figure 4:
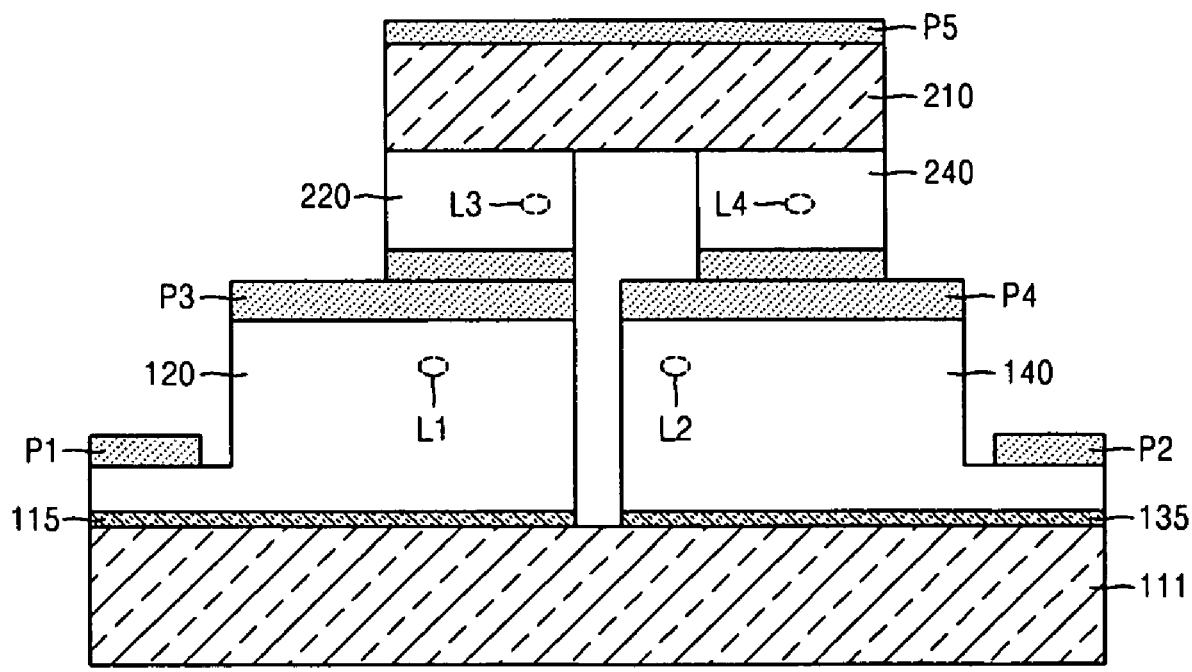
FIG. 4 is a schematic cross-sectional view of a semiconductor laser diode array according to another embodiment of the present invention.

FIG. 4 is a schematic cross-sectional view of a semiconductor laser diode array according to another embodiment of the present invention. Referring to FIG. 4, the semiconductor laser diode array according to the current embodiment includes a lower substrate 111, first and second laser generating regions 120 and 140 disposed on the lower substrate 111, third and fourth laser generating regions 220 and 240 vertically bonded to the first and second laser generating regions 120 and 140, respectively, and an upper substrate 210 supported by the third and fourth laser generating regions 220 and 240.

In the current embodiment, unlike in the previous embodiment, the lower substrate 111 is formed of a conductive material, such as GaN or SiC. The first laser generating region 120 is electrically insulated from the second laser generating region 140 in order to independently drive the first through fourth laser generating regions 120, 140, 220, and 240. For electrical insulation, a first current limiting layer 115 is interposed between the lower substrate 111 and the first laser generating region 120 and a second current limiting layer 135 is interposed between the lower substrate 111 and the second laser generating region 140. The first and second current limiting layers 115 and 135 are constructed of an undoped or p-doped semiconductor. By using the first and second current limiting layers 115 and 135, the lower substrate 111 can be made of a conductive material instead of a non-conductive material.

Because the semiconductor laser diode array according to the present embodiment has substantially the same structure as the embodiment illustrated in FIG. 1 except for the first and second current limiting layers 115 and 135, a detailed explanation thereof is being omitted.

Figure 5:
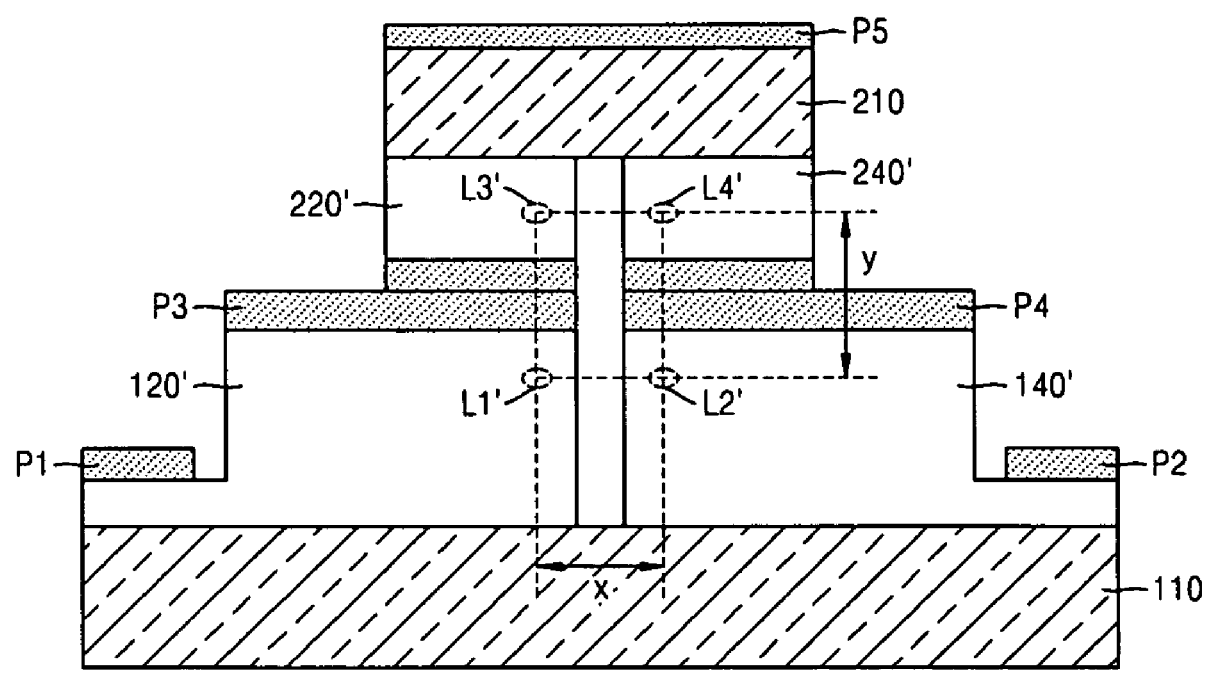
FIG. 5 is a schematic cross-sectional view of a semiconductor laser diode array according to a further embodiment of the present invention.

FIG. 5 is a schematic cross-sectional view of a semiconductor laser diode array according to a further embodiment of the present invention.

Referring to FIG. 5, the semiconductor laser diode array according to the current embodiment includes a lower substrate 110, first and second laser generating regions 120' and 140' disposed on the lower substrate 110, third and fourth laser generating regions 220' and 240' vertically bonded to the first and second laser generating regions 120' and 140', respectively, and an upper substrate 210 supported by the third and fourth laser generating regions 220' and 240'. Unlike in the embodiments illustrated in FIGS. 1 and 4, first and second light-emitting points L1' and L2' in the first and second laser generating regions 120' and 220' are aligned vertically with third and fourth light-emitting points L3' and L4' in the third and fourth laser generating regions 140' and 240', respectively. That is, the first through fourth light-emitting points L1' through L4' are apexes of a rectangle formed along the sides of the first through fourth laser generating regions 120', 140', 220', and 240'. Spacing x between the first and second light-emitting points L1' and L2' or between the third and fourth light-emitting points L3' and L4' and spacing y between the first and third light-emitting points L1' and L3' or between the second and fourth light-emitting points L2' and L4' may be less than approximately 50 μm, and preferably approximately 20 μm.

When the semiconductor laser diode array of the current embodiment is used in a laser scanning device for a copier or printer, it is possible to maintain regular intervals between laser spots in one direction by rotating the semiconductor laser diode array by a predetermined angle.

Because the semiconductor laser diode array according to the present embodiment has substantially the same structure as the embodiment illustrated in FIG. 1 except for positions where the first through fourth light-emitting points L1' through L4' are aligned, a detailed description thereof is being omitted.

While in the above description, the semiconductor laser diode arrays according to the embodiments of the present invention are made of a nitride-based semiconductor material, the present invention will be applied to a typical semiconductor laser diode array formed from a different material. While four laser generating regions in the semiconductor laser diode according to the present invention emits laser light of the same wavelength band, the wavelength band of laser light emitted from first and second laser generating regions may be different from the wavelength band of laser light emitted from third and fourth laser generating regions depending on the type of compound semiconductor in the four laser generating regions.

As described above, the semiconductor laser diode array according to the present invention with two laser diode chips having a dual ridge structure vertically bonded to each other can offer advantages as indicated hereafter. First, light-emitting points can be arranged at sufficiently small intervals. Second, due to its simple electrode structure, the semiconductor laser diode array of the present invention is easy to fabricate. Third, the present invention allows selection of high-quality laser diode chips having a dual ridge structure before bonding, thus providing uniform performance across laser generating regions and an improved yield rate.

While the present invention has been particularly shown and described with reference to exemplary embodiments thereof in order to aid in the understanding thereof, it will be understood by those of ordinary skill in the art that various changes in form and details may be made therein without departing from the spirit and scope of the present invention as defined by the following claims.

What is claimed is:

1. A semiconductor laser diode array comprising:
a lower semiconductor laser diode chip having a dual structure including a lower substrate, a first laser generating region having a first surface disposed on the lower substrate, and a second laser generating region having a first surface disposed on the lower substrate, the second laser generating region being entirely separated from the first laser generating region, and the first and second laser generating regions each having a respective second surface opposed to the first surface thereof, respectively;
an upper semiconductor laser diode chip having a dual structure including an upper substrate, a third laser generating region having a first surface disposed on the upper substrate, and a fourth laser generating region having a first surface disposed on the upper substrate, the fourth laser generating region being entirely separated from the third laser generating region, and the third and fourth laser generating regions each having a respective second surface opposed to the first surface thereof, respectively; and
an electrode unit electrically connecting the first through fourth laser generating regions to the outside,
wherein the second surfaces of the first and second laser generating regions are vertically bonded to the second surfaces of the third and fourth laser generating regions, respectively, so that first through fourth light-emitting points respectively provided in the first through fourth laser generating regions from which laser beams are emitted are arranged in a two-dimensional fashion,
wherein the electrode unit comprises:
a first electrode of a first conductivity type formed on a stepped portion of the first laser generating region proximate to the first surface of the first laser generating region;
a second electrode of the first conductivity type formed on a stepped portion of the second laser generating region proximate to the first surface of the second laser generating region;

a third electrode of a second conductivity type formed on the respective second surfaces of the first and third laser generating regions, the second conductivity type being opposite to the first conductivity type;

a fourth electrode of the second conductivity type formed on the respective second surfaces of the second and fourth laser generating regions; and a fifth electrode of the first conductivity type formed on a first surface of the upper substrate opposite to a second surface of the upper substrate on which the respective first surfaces of the third and fourth laser generating regions are disposed, wherein the first through fifth electrodes are configured to be independently addressable so as to independently drive the first through fourth laser generating regions, and wherein the first laser generating region includes a first n-contact layer, a first n-clad layer, a first active layer, a first p-clad layer, a first p-metal layer and a first bonding metal layer sequentially formed on the lower substrate;

the second laser generating region includes a second n-contact layer, a second n-clad layer, a second active layer, a second p-clad layer, a second p-metal layer and a second bonding metal layer sequentially formed on the lower substrate;

the third laser generating region includes a third n-clad layer, a third active layer, a third p-clad layer, a third p-metal layer and a third bonding metal layer sequentially formed on the second surface of the upper substrate;

the fourth laser generating region includes a fourth n-clad layer, a fourth active layer, a fourth p-clad layer, a fourth p-metal layer and a fourth bonding metal layer sequentially formed on the second surface of the upper substrate, the first bonding metal layer in the first laser generating region is attached to the third bonding metal layer in the third laser generating region; and the second bonding metal layer in the second laser generating region is attached to the fourth bonding metal layer in the fourth laser generating region.

2. The array of claim 1, wherein a distance between centers of each of the light-emitting points is less than approximately 50 μm.

3. The array of claim 2, wherein the first through fourth light-emitting points are arranged in a staggered fashion when viewed in a horizontal direction.

4. The array of claim 3, wherein the first through fourth light-emitting points are arranged at uniform horizontal spacings.

5. The array of claim 3, wherein the horizontal spacings are less than approximately 30 μm.

6. The array of claim 2, wherein the first and second light-emitting points are aligned vertically with third and fourth light-emitting points, respectively.

7. The array of claim 1, wherein:
the first electrode is formed on a stepped portion of a first n-contact layer in the first laser generating region;
the second electrode is formed on a stepped portion of a second n-contact layer in the second laser generating region;
the third electrode is formed on an exposed part outside a region of the first bonding metal layer that is bonded to the third bonding metal layer;
the fourth electrode is formed on an exposed part outside a region of the second bonding metal layer that is bonded to the fourth bonding metal layer.

8. The array of claim 7, wherein the areas of the third and fourth bonding metal layers are less than the areas of the first and second bonding metal layers, respectively, so as to expose portions of the first and second bonding metal layers.

9. The array of claim 1, wherein the upper substrate is formed of a conductive material.

10. The array of claim 9, wherein the upper substrate is formed of one of GaN or SiC.

11. The array of claim 1, wherein the lower substrate is formed of a non-conductive material.

12. The array of claim 11, wherein the lower substrate is a sapphire substrate.

13. The array of claim 1, wherein the lower substrate is conductive.

14. The array of claim 13, further comprising first and second current limiting layers interposed between the lower substrate and the first laser generating region and between the lower substrate and the second laser generating region, respectively, so as to electrically insulate the first laser generating region from the second laser generating region.

15. The array of claim 13, wherein the lower substrate is formed of one of GaN or SiC.

16. The array of claim 1, wherein the first through fourth laser generating regions include an n-clad layer, an active layer and a p-clad layer, and the p-clad layer has a ridge structure.

17. The array of claim 1, wherein each of the first through fourth laser generating regions includes an n-clad layer, an active layer and a p-clad layer that are formed of a compound selected among nitride semiconductor compounds represented by the general formula $Al_xIn_yGa_{1-(x+y)}N$ ($0 \leq x \leq 1$, $0 \leq y \leq 1$, and $0 \leq x+y \leq 1$) as a main element.

18. The array of claim 1, wherein the first and second light emitting points of the first and second laser generating regions emit laser light of the same wavelength band.

19. The array of claim 1, wherein the first through fourth light emitting points of the first through fourth laser generating regions emit laser light of the same wavelength band.

20. The array of claim 1, wherein the first and second light emitting points of the first and second laser generating regions each emit laser light of a different wavelength band than laser light emitted from the third and fourth light emitting points of the third and fourth generating regions.

21. The array of claim 6, wherein the first through fourth light emitting points constitute apexes of a rectangle formed along sides of the first through fourth laser generating regions at which the first through fourth light emitting points are arranged.

* * * * *